(12) United States Patent
Takahashi

(10) Patent No.: US 11,300,618 B2
(45) Date of Patent: Apr. 12, 2022

(54) SWITCH FAILURE DETECTION DEVICE

(71) Applicant: Yazaki Corporation, Tokyo (JP)

(72) Inventor: Atsushi Takahashi, Susono (JP)

(73) Assignee: Yazaki Corporation, Tokyo (JP)

(*) Notice: Subject to any disclaimer, the term of this patent is extended or adjusted under 35 U.S.C. 154(b) by 75 days.

(21) Appl. No.: 16/929,391

(22) Filed: Jul. 15, 2020

(65) Prior Publication Data

US 2021/0018564 A1    Jan. 21, 2021

(30) Foreign Application Priority Data

Jul. 19, 2019   (JP) .............................. JP2019-133779
Jul. 19, 2019   (JP) .............................. JP2019-133780

(51) Int. Cl.
*G01R 15/14*      (2006.01)
*G01R 31/327*     (2006.01)

(52) U.S. Cl.
CPC ........ *G01R 31/3277* (2013.01); *G01R 15/144* (2013.01)

(58) Field of Classification Search
CPC  G01R 11/25; G01R 19/16571; G01R 22/068; G01R 31/14; G01R 31/2617; G01R 31/2633; G01R 31/3277; G01R 31/3275; G01R 15/144; G01R 15/002; G01R 31/006; G01R 31/327

See application file for complete search history.

(56) References Cited

U.S. PATENT DOCUMENTS

2011/0279985 A1    11/2011   Horman et al.
2016/0336736 A1    11/2016   Nomura et al.

FOREIGN PATENT DOCUMENTS

DE    102009017275 A1    10/2010
EP         2843837 A1     3/2015
JP       2019-066364 A     4/2019

*Primary Examiner* — Son T Le

(74) *Attorney, Agent, or Firm* — Banner & Witcoff, Ltd.

(57) ABSTRACT

A switch failure detection device includes switches provided on branch paths, current detection units provided on the branch paths, the current detection units being configured to output a current detection signal, a storage unit configured to store an initial value of the current detection signal, the initial value being output from the current detection units, a switch control unit to turn off one of the plurality of switches one by one with at least another one of the plurality of switches being turned on and a first failure detection unit configured to compare the initial value and a value of a first current detection signal output from a corresponding one of the current detection units when the one of the switches is turned off, the first failure detection unit being further configured to detect a first failure of the plurality of switches based on a result of the comparison.

9 Claims, 14 Drawing Sheets

(Q1 NOT IN CASE OF FAILURE)

(Q1 IN CASE OF FAILURE)

(Q2 NOT IN CASE OF FAILURE)

(Q2 IN CASE OF FAILURE)

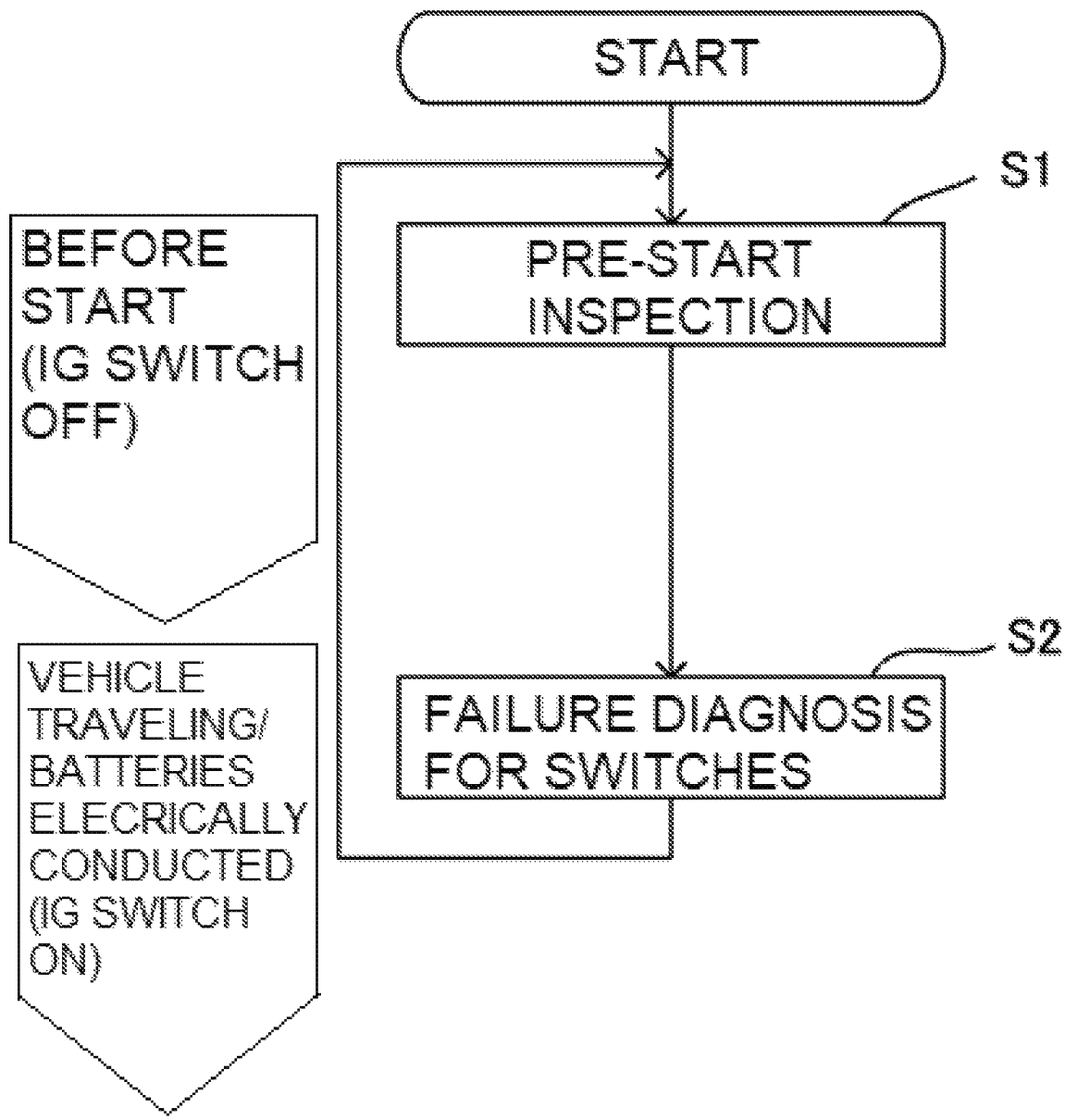

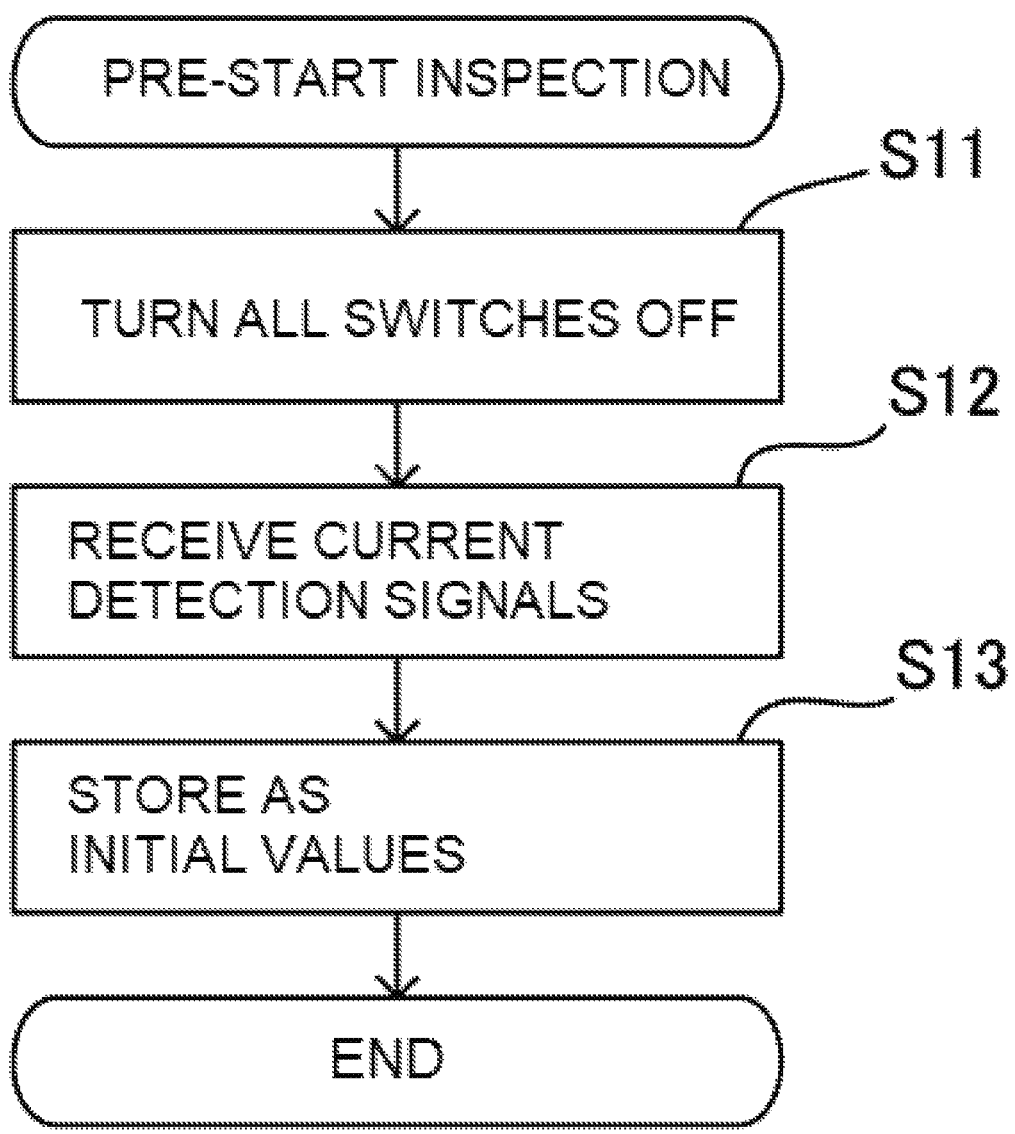

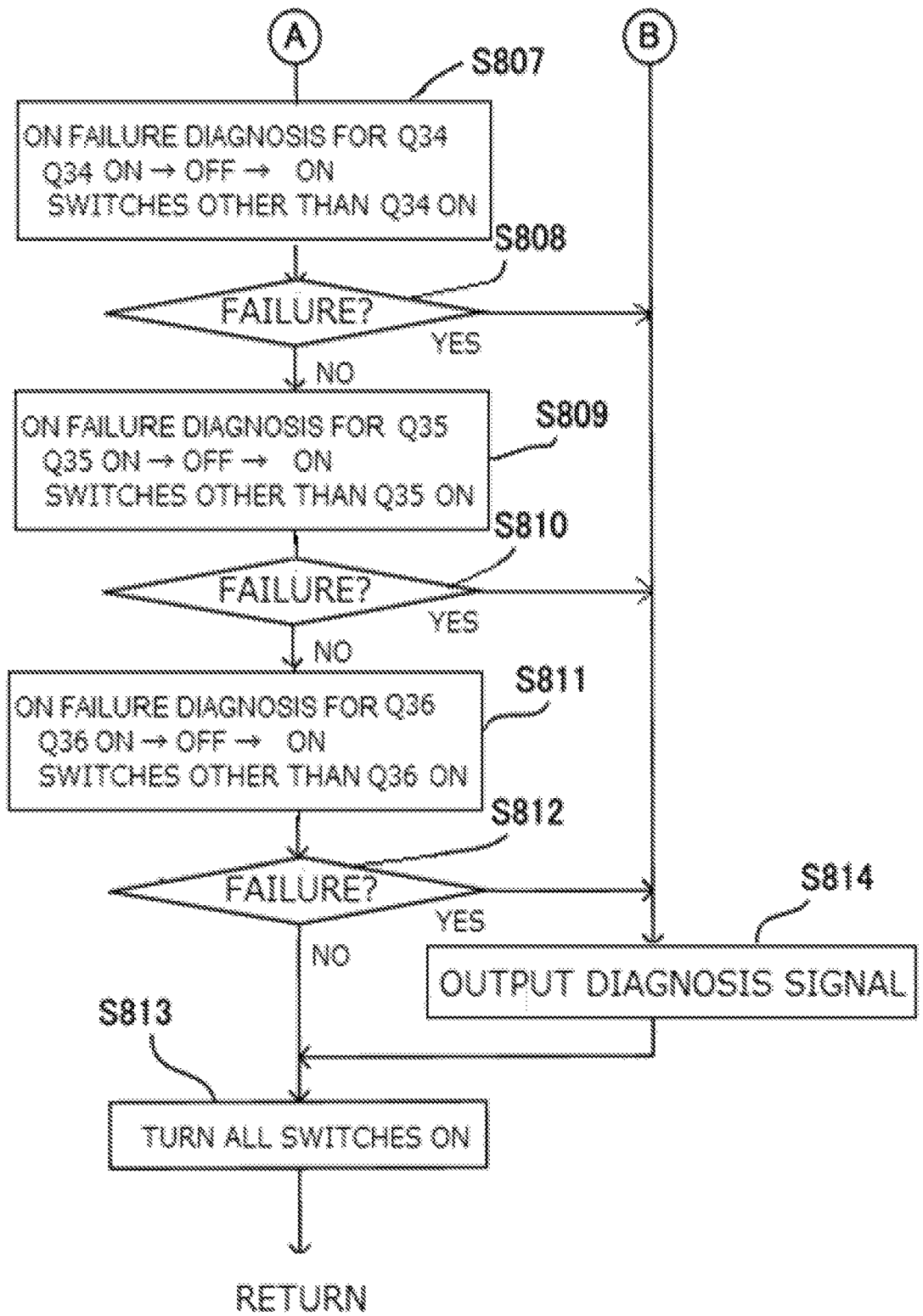

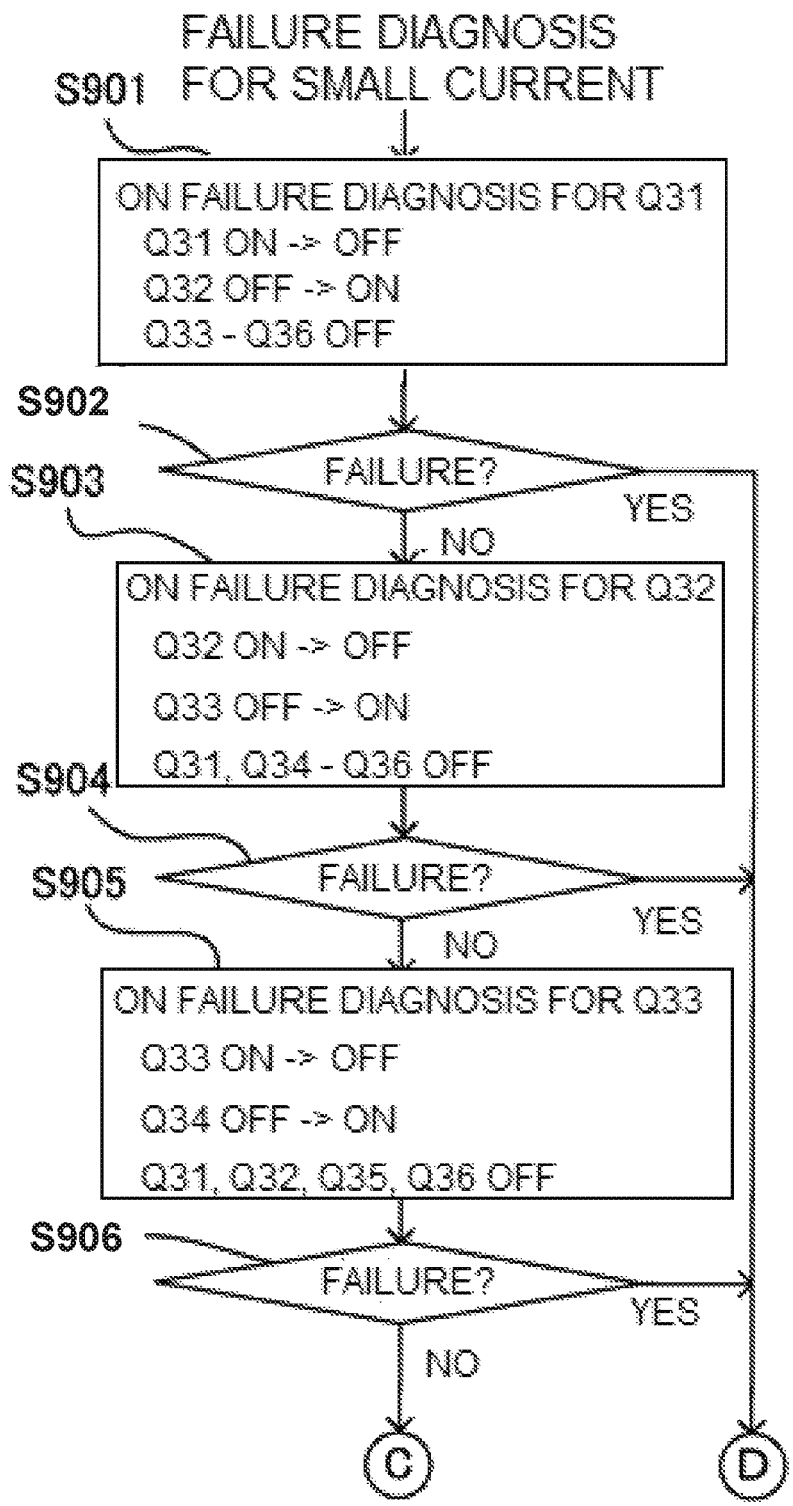

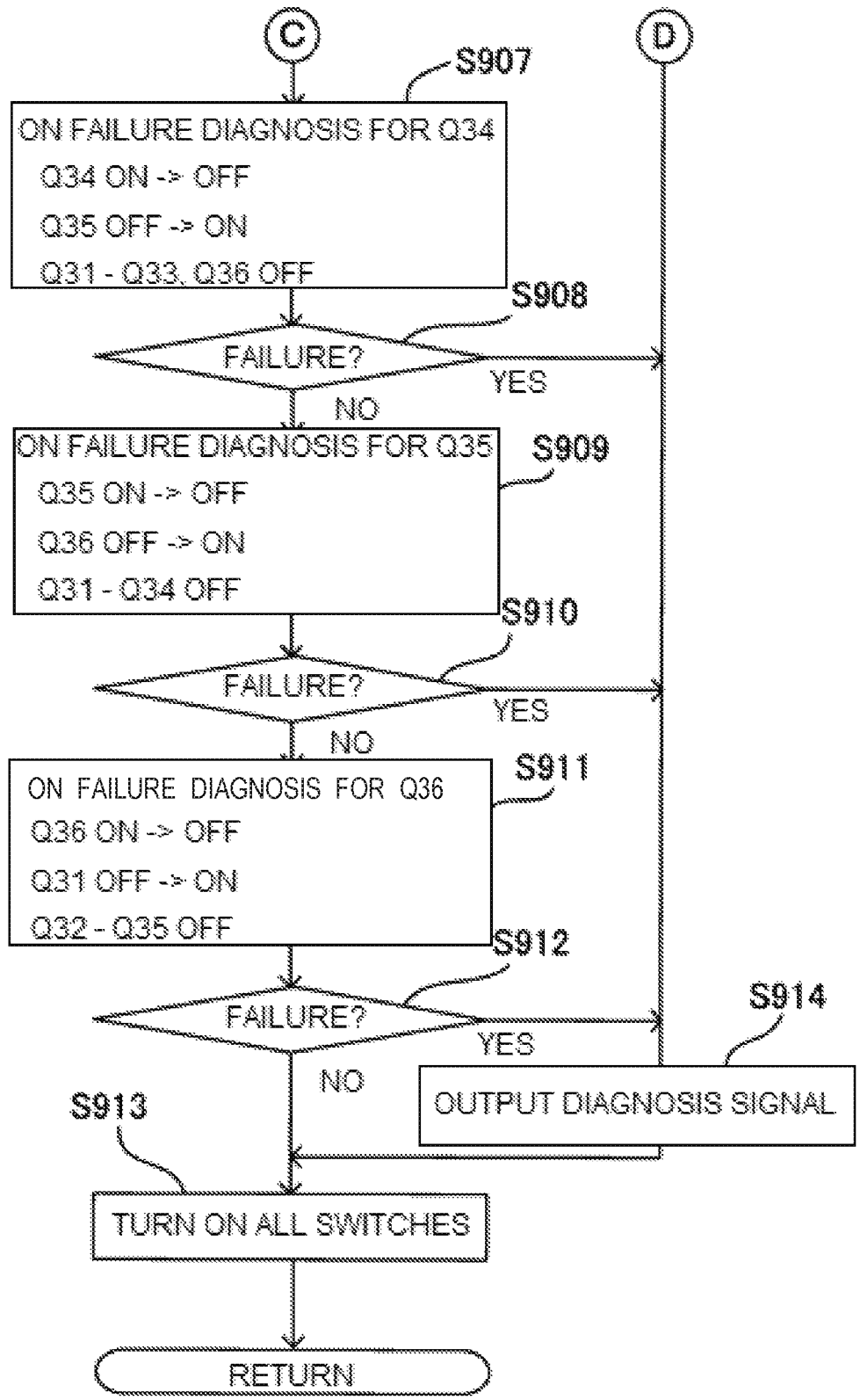

SWITCH FAILURE DETECTION DEVICE

CROSS-REFERENCE TO RELATED APPLICATION

The present application claims priority to Japanese Patent Applications Nos. 2019-133779 and 2019-133780 both filed on Jul. 19, 2019, the entire content of which is incorporated herein by reference.

TECHNICAL FIELD

The present invention relates to a switch failure detection device.

BACKGROUND

A related-art switch failure detection device is provided with a plurality of branch paths that divide a current path into a plurality of current paths, and switches and current detection units respectively provided in the plurality of branch paths (for example, see JP2019-66364A). The current detection units are sensors that detect currents flowing through the plurality of branch paths. A microcomputer that controls the plurality of switches turns on the plurality of switches and then turns off the plurality of switches for a predetermined period of time. The microcomputer detects ON currents when all of the plurality of switches are turned on and detects OFF currents when the plurality of switches are turned off using the current detection units, and detects a failure of the switches when there is no change in currents between the ON currents and the OFF currents.

However, the currents flowing through the plurality of branch paths may not be constant but rather, may fluctuate. For this reason, it is difficult to determine what has brought about fluctuation in the currents. A drop in the currents may be caused by, for example, the plurality of switches being properly turned off thereby making the currents flowing through the plurality of branch paths cut off. Change in the currents may be caused even by continuously flowing currents when a switch is experiencing a failure being unable to turn off the plurality of switches thereby letting the currents continue flowing where the flowing currents keep fluctuating. Therefore, accurate failure detection may be hindered. With this in mind, it is conceivable to perform zero adjustments by offset adjustments or the like at the time of assembling to improve accuracy of the current detection units, which, however, takes time and effort.

Illustrative aspects of the present invention provide a switch failure detection device configured to detect a failure of a switch with high accuracy.

According to an illustrative aspect of the present invention, a switch failure detection device includes a plurality of switches respectively provided on a plurality of branch paths, a current path branching into the plurality of current paths, a plurality of current detection units provided on the plurality of branch paths respectively, each of the current detection units being configured to output current detection signal in accordance with an electrical current flowing through each of the plurality of branch paths, a storage unit configured to store an initial value of the current detection signal, the initial value being to be output from each of the current detection units when the plurality of switches are turned off, a switch control unit configured to turn off one of the plurality of switches with at least another one of the plurality of switches being turned on and a first failure detection unit configured to compare the initial value and a value of a first current detection signal output from corresponding one of the current detection units when the one of the plurality of switches is turned off by the switch control unit, the first failure detection unit being configured to detect a first failure of the plurality of switches based on a result of the comparison.

Other aspects and advantages of the invention will be apparent from the following description, the drawings and the claims.

BRIEF DESCRIPTION OF THE DRAWINGS

FIG. 3 is a flowchart showing a processing procedure of a microcomputer shown in FIG. 1;

FIG. 4 is a flowchart showing a procedure of pre-start inspection processing of the microcomputer shown in FIGS. 1 and 6;

FIG. 11 is a flowchart showing a procedure of failure diagnosis for a small current of the microcomputer shown in FIG. 6.

DETAILED DESCRIPTION

An embodiment of the present invention will be described below with reference to the drawings.

Figure 1:
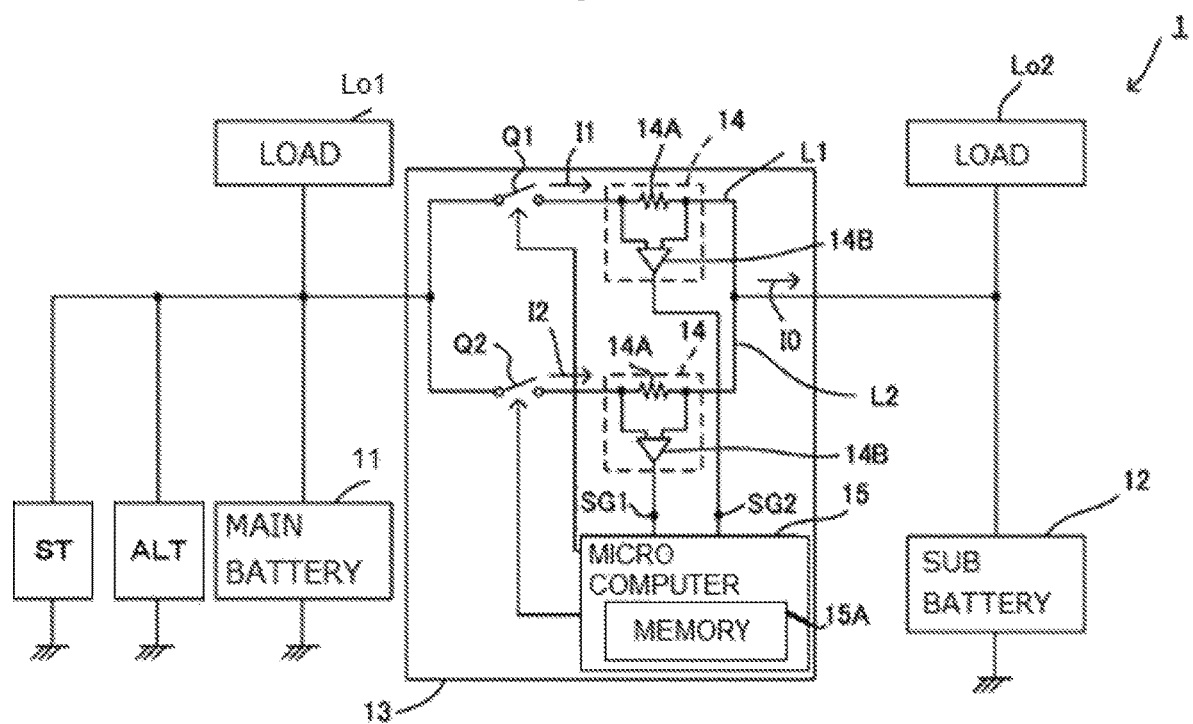
FIG. 1 is a circuit diagram showing a vehicle power supply device including a switch failure detection device according to an embodiment of the present invention.

FIG. 1 is a circuit diagram showing a vehicle power supply device 1 including a switch failure detection device according to the embodiment of the present invention. The vehicle power supply device 1 shown in FIG. 1 includes a main battery 11 and a sub-battery 12 to be mounted on a vehicle.

The main battery 11 is formed by an inexpensive battery such as a lead battery and is connected to a starter ST, an alternator ALT, and a load Lo1. The sub-battery 12 is formed by a high-performance battery such as a lithium-ion battery and a nickel-hydrogen battery and is connected to a load Lo2.

A current path between the main battery 11 and the sub-battery 12 is branched into two current paths including two branch paths L1, L2. The branch paths L1, L2 are provided with a switching module 13 (failure detection device). The switching module 13 includes a plurality of switches Q1, Q2 respectively provided on the branch paths L1, L2, current detection units 14 configured to output current detection signals SG1, SG2 in accordance with currents I1, I2 respectively flowing through the plurality of branch paths L1, L2, and a microcomputer 15. The microcomputer 15 functions as a switch control unit, a first failure detection unit, and a second failure detection unit.

Each of the switches Q1, Q2 is formed by an electrolytic effect transistor. Each of the plurality of current detection units 14 includes a shunt resistor 14A and a differential amplifier 14B that amplifies the difference between voltages at both ends of the shunt resistor 14A. The shunt resistor 14A is provided on each of the branch paths L1, L2. The shunt resistor 14A provided on the branch path L1 is connected in series to the switch Q1. The shunt resistor 14A provided on the branch path L2 is connected in series to the switch Q2. The differential amplifier 14B is connected to both ends of the shunt resistor 14A, amplifies the difference between voltages at the both ends of the shunt resistor 14A, and supplies the current detection signals SG1, SG2 in accordance with the currents I1, I2 flowing through the branch paths L1, L2.

The microcomputer 15 is a well-known microcomputer including a CPU, a ROM, a RAM, and the like, which controls the entire vehicle power supply device 1. The microcomputer 15 is connected to gates of the switches Q1, Q2, and supplies gate signals to control ON and OFF states of the switches Q1, Q2. The microcomputer 15 includes a memory 15A (storage unit) that stores initial values $SG1_0$, $SG2_0$ of the current detection signals SG1, SG2, which will be described later.

When it is needed to connect the main battery 11 and the sub-battery 12, for example, when the sub-battery 12 is to be regenerative-charged, the microcomputer 15 turns on both of the switches Q1, Q2. When the switches Q1, Q2 are to be turned on, the microcomputer 15 starts a failure detection process for the switches Q1, Q2.

Next, how a failure detection for the switches Q1, Q2 is carried out will be described with reference to FIGS. 2A to 2F. At first, both of the switches Q1, Q2 are turned on (time period T1 in FIGS. 2A and 2B). Here, it is assumed that shunt resistors 14A of the current detection units 14 respectively provided in the branch paths L1, L2 have the same resistance value. If both of the switches Q1, Q2 are turned on, the currents I1, I2 flowing through the branch paths L1, L2 detected by the current detection units 14 are equal (FIGS. 2C to 2F). At this time the currents I1 I2 is half a total current I0, respectively.

Figure 2A:
FIGS. 2A to 2F are time charts of switches Q1, Q2 and currents I1, I2 shown in FIG. 1.
Figure 2B:
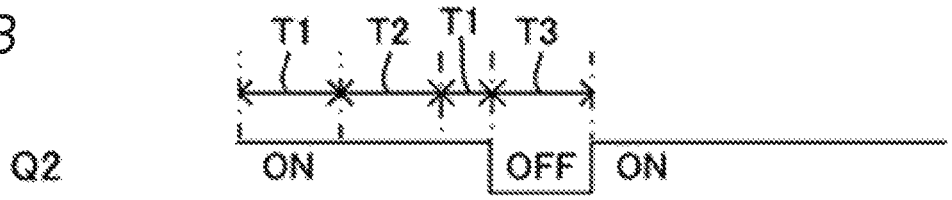
Figure 2C:
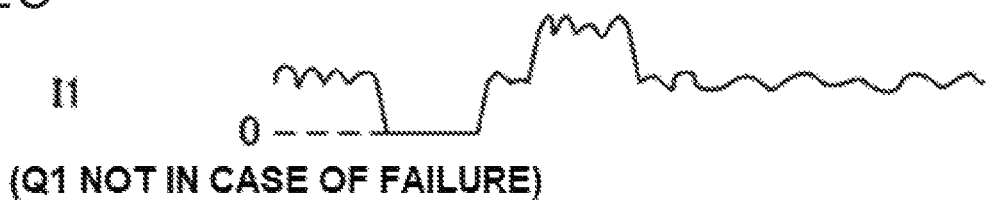
Figure 2D:
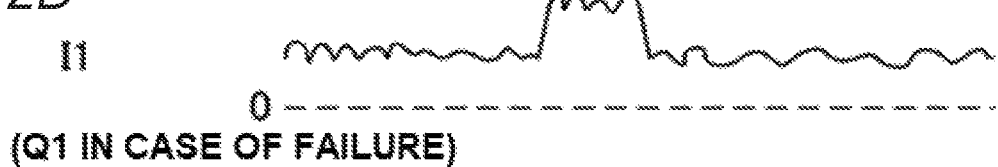
Figure 2E:

Next, only the switch Q1 is turned off for a predetermined period of time (for example, 2 ms to 10 ms) (time period T2 in FIG. 2A). At this time, if the switch Q1 is working properly, the current I1 flowing through the branch path L1 becomes 0 A (ampere) as shown in FIG. 2C. The current that has been flowing through the branch path L1 now flows through the branch path L2. Accordingly, the current I2 flowing through the branch path L2 increases (doubles) as shown in FIG. 2E and becomes equal to the total current I0. Similarly, when only the switch Q2 is turned off for a predetermined period of time (time period T3 in FIG. 2B), the current I2 flowing through the branch path L2 becomes 0 A as shown in FIG. 2E if the switch Q2 is properly turned off. Since the switch Q2 is turned on while the switch Q1 is turned off, conduction between the batteries 11, 12 is maintained. Since the switch Q1 is turned on while the switch Q2 is turned off, the conduction between the batteries 11, 12 is maintained.

Figure 2F:
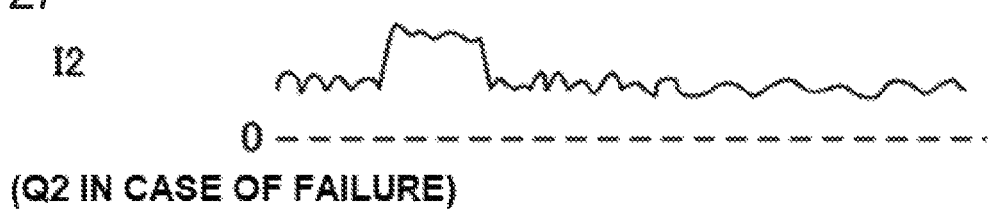

Meanwhile, when the switch Q1 is turned off for a predetermined period of time (time period T2 in FIG. 2) and if a sticking or the like occurs in the switch Q1 and the switch Q1 cannot be turned off, the current continues flowing through the branch path L1 via the switch Q1. For this reason, as shown in FIG. 2D, the current I1 would not drop to 0 A even if the switch Q1 is controlled to be off. Similarly, when the switch Q2 is turned off for a predetermined time (time period T3 in FIG. 2B) and if a sticking or the like occurs in the switch Q2 and the switch Q2 cannot be turned off, the current continues flowing through the branch path L2 via the switch Q2. For this reason, as shown in FIG. 2F, the current I2 would not drop to 0 A even if the switch Q2 is controlled to be off.

The microcomputer 15 in the present embodiment determines whether there has been a change in the currents I1, I2 when the branch paths L1, L2 are cut off one by one, thereby detecting a failure of the switches Q1, Q2 provided in the branch paths L1, L2. When the switches Q1, Q2 are turned off, the microcomputer 15 receives the current detection signals SG1, SG2 that have been output from the current detection units 14 and stores the current detection signals SG1, SG2 in the memory 15A as the initial values (zero outputs) $SG1_0$, $SG2_0$. The microcomputer 15 then respectively compares the current detection signals SG1, SG2 at a time of the switches Q1, Q2 being turned on or off, with the initial values $SG1_0$, $SG2_0$ stored in the memory 15A, thereby determining whether there has been a change in the currents I1, I2.

Next, detailed operation of the vehicle power supply device 1 will be described with reference to a flowchart in FIG. 3. First, the microcomputer 15 receives the current detection signals SG1, SG2 that have been output from the current detection units 14 when an ignition (IG) switch is turned off and stores the current detection signals SG1, SG2 in the memory 15A as the initial values $SG1_0$, $SG2_0$, thereby performing pre-start inspection (step S1). While the IG switch is being turned on (while the vehicle is traveling and the batteries 11, 12 are being electrically conductive), the microcomputer 15 performs a failure diagnosis of the switches Q1, Q2 (step S2).

Details of the pre-start inspection will be described with reference to FIG. 4. First, the microcomputer 15 turns off both of the switches Q1, Q2 (step S11). Accordingly, the currents I1, I2 flowing through the branch paths L1, L2 become 0 A. Next, the microcomputer 15 receives the current detection signals SG1, SG2 that have been output from the current detection units 14 respectively provided in the branch paths L1, L2 (step S12). Thereafter, the microcomputer 15 stores the received current detection signals SG1, SG2 as the initial values $SG1_0$, $SG2_0$ of each of the current detection units 14 (step S13) and the pre-start inspection ends.

Figure 5:
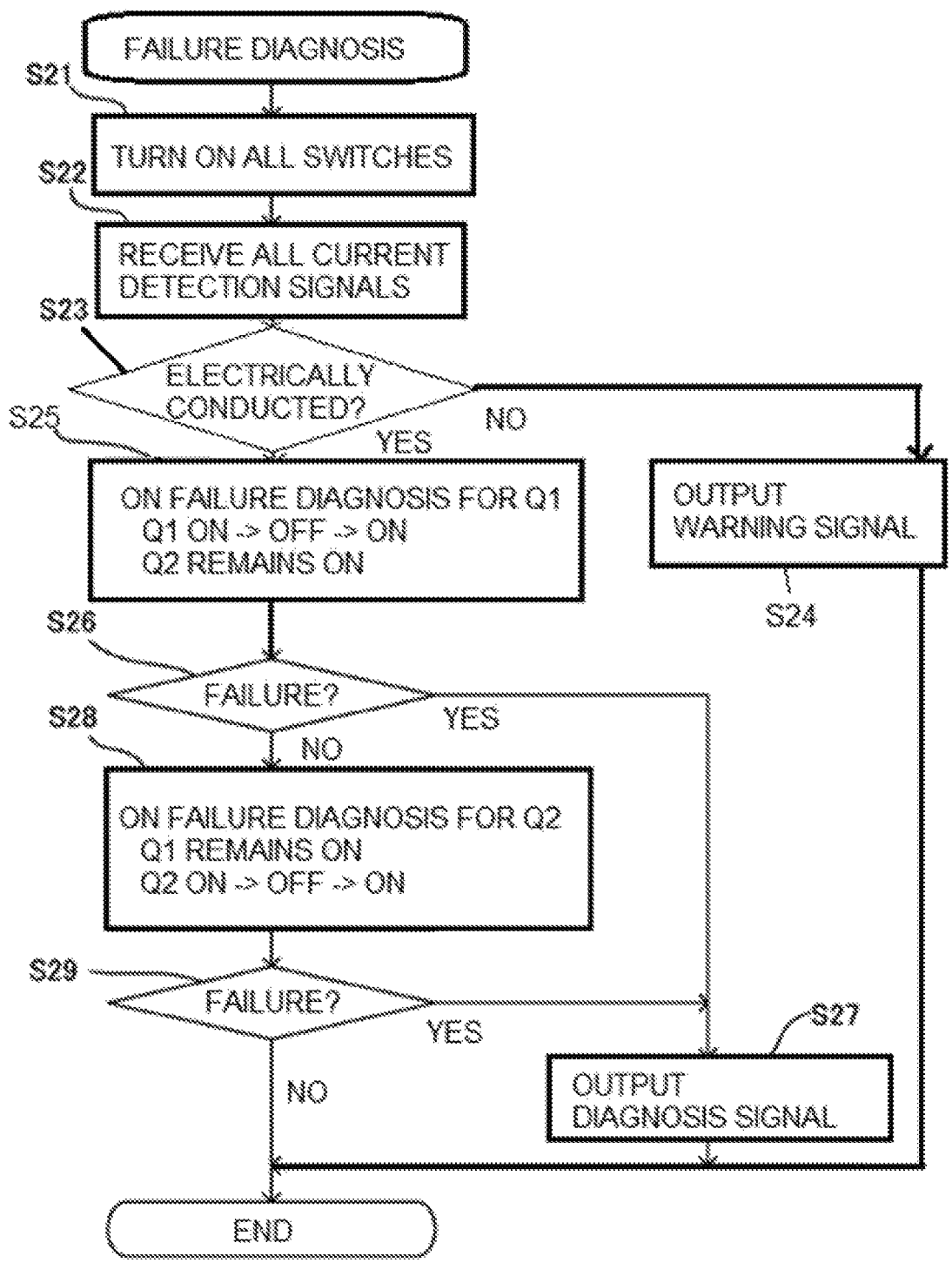
FIG. 5 is a flowchart showing a procedure of failure diagnosis of the microcomputer shown in FIG. 1.

Details of the failure diagnosis will be described with reference to FIG. 5. When the microcomputer 15 determines that it is necessary to connect the main battery 11 and the sub-battery 12, the microcomputer 15 starts a failure diagnosis processing for detecting a failure of the switches Q1, Q2 on a predetermined regular basis (for example, 1 s to 10 s).

In the failure diagnosis processing, the microcomputer 15 turns on both of the switches Q1, Q2 (step S21). Next, the microcomputer 15 receives the current detection signals SG1, SG2 that have been output from the current detection units 14 provided in both of the branch paths L1, L2 (step S22). The microcomputer 15 temporarily stores the current detection signals SG1, SG2 received in step S22 in the memory 15A as current detection signals $SG1_{on}$, $SG2_{on}$ when the switches Q1 and Q2 are turned on, i.e. the switches Q1 and Q2 are under ON control.

Thereafter, the microcomputer 15 compares the current detection signals $SG1_{on}$, $SG2_{on}$ with the initial values $SG1_0$, $SG2_0$ stored in the memory 15A to determine whether the branch paths L1, L2 are electrically conducted conductive (step S23).

In step S23, if $SG1_{on} \approx SG1_0$ or $SG2_{on} \approx SG2_0$, the microcomputer 15 determines that the switches Q1, Q2 are not turned on and the branch paths L1, L2 are not electrically conductive, that is, the current I1 or I2 is 0 A. To be precise, the microcomputer 15 determines $SG1_{on} \approx SG1_0$ when $SG1_{on} \leq (SG1_0 + \text{predetermined value})$ and determines $SG2_{on} \approx SG2_0$ when $SG2_{on} \leq (SG2_0 + \text{predetermined value})$.

When determining that at least one of the branch paths L1, L2 is not electrically conductive (N in step S23), the microcomputer 15 outputs a warning signal (step S24) and the processing ends. When receiving the warning signal, a meter (not shown) notifies of an OFF failure, in which at least one of the switches Q1, Q2 is kept to be off and cannot be turned on.

When the microcomputer 15 determines that both of the branch paths L1, L2 are electrically conductive (Y in step S23), the processing proceeds to next step S25 and performs an ON failure diagnosis of the switch Q1. In step S25, the microcomputer 15 controls the switch Q1 to be off for a predetermined period of time and then turns the switch Q1 on again. The switch Q2 remains on. The microcomputer 15 receives the current detection signal SG1 that has been output from the current detection unit 14 when the switch Q1 is controlled to be off in step S25 and temporarily stores the current detection signal SG1 in the memory 15A as a current detection signal $SG1_{off}$ when the switch Q1 is turned off, i.e., the switch Q1 is under OFF control.

Next, the microcomputer 15 detects a failure of the switch Q1 based on a comparison between the current detection signal $SG1_{on}$ under ON control and the initial value $SG1_0$ stored in the memory 15A and a comparison of the current detection signal $SG1_{off}$ under OFF control and the initial value $SG1_0$ (step S26).

In step S26, if $SG1_{on} > SG1_0$ and $SG1_{off} \approx SG1_0$, the microcomputer 15 determines that the current I1 has been changed by turning off the switch Q1 and that the switch Q1 is working properly. If $SG1_{on} > SG1_0$ and $SG1_{off} > SG1_0$, the microcomputer 15 determines that the current I1 has not been changed and the switch Q1 is not turned off, thereby detecting a failure of the switch Q1. To be precise, the microcomputer 15 determines $SG1_{on}$, $SG1_{off} > SG1_0$ when $SG1_{on}$, $SG1_{off} > (SG1_0 + \text{predetermined value})$, and determines $SG1_{off} \approx SG1_0$ when $SG1_{off} < (SG1_0 + \text{predetermined value})$.

When detecting the failure of the switch Q1 (Y in step S26), the microcomputer 15 outputs a diagnosis signal (step S27) and the processing ends. When receiving the diagnosis signal, the meter (not shown) notifies of an ON failure in which the switch Q1 is kept on and cannot be turned off.

When the microcomputer 15 determines that the switch Q1 is working properly (N in step S26), the processing proceeds to next step S28 in which the microcomputer 15 performs an ON failure diagnosis of the switch Q2. In step S28, the microcomputer 15 controls the switch Q2 to be off for a predetermined period of time and then turns the switch Q2 on again. The switch Q1 remains on. The microcomputer 15 receives the current detection signal SG2 that has been output from the current detection unit 14 when the switch Q2 is turned off in step S28, and temporarily stores the current detection signal SG2 in the memory 15A as a current detection signal $SG2_{off}$ under OFF control.

Next, the microcomputer 15 detects a failure of the switch Q2 based on a comparison between the current detection signal $SG2_{on}$ under ON control and the initial value $SG2_0$ stored in the memory 15A and a comparison of the current detection signal $SG2_{off}$ under OFF control and the initial value $SG2_0$ (step S29).

In step S29, if $SG2_{on} > SG2_0$ and $SG2_{off} \approx SG2_0$, the microcomputer 15 determines that the current I2 has been changed by turning off the switch Q2 and that the switch Q2 is working properly. If $SG2_{on} > SG2_0$ and $SG2_{off} > SG2_0$, the microcomputer 15 determines that the current I2 has not changed and the switch Q2 is not turned off, thereby detecting the failure of the switch Q2. To be precise, the microcomputer 15 determines $SG2_{on}$, $SG2_{off} > SG2_0$ when $SG2_{on}$, $SG2_{off} > (SG2_0 + \text{predetermined value})$, and determines $SG2_{off} \approx SG2_0$ when $SG2_{off} \leq (SG2_0 + \text{predetermined value})$.

When detecting the failure of the switch Q2 (Y in step S29), the microcomputer 15 outputs a diagnosis signal (step S27) and the processing ends. When receiving the diagnosis signal, the meter (not shown) notifies of an ON failure in which the switch Q2 is kept to be on and cannot be turned off.

When the microcomputer 15 determines that the switch Q2 is working properly (N in step S29), the processing ends.

According to the embodiment described above, the microcomputer 15 detects a failure of the switches Q1, Q2 based on a comparison between the current detection signals $SG1_{on}$, $SG2_{on}$ under ON control of the switches Q1, Q2 and the initial values $SG1_0$, $SG2_0$, respectively and a comparison between the current detection signals $SG1_{off}$, $SG2_{off}$ under OFF control of the switches Q1, Q2 and the initial values $SG1_0$, $SG2_0$, respectively. Accordingly, an influence of zero outputs of the current detection signals SG1, SG2 can be canceled even without offset adjustments of the current detection units 14, and the detection accuracy for the ON failure, i.e., failure in which the switches Q1, Q2 cannot be turned off, of the switches Q1, Q2 can be improved even if the currents I1, I2 have changed.

According to the embodiment described above, the microcomputer 15 detects the failure of the switches Q1, Q2 when both of the current detection signals $SG1_{on}$, $SG1_{off}$ and both of the current detection signals $SG2_{on}$, $SG2_{off}$ output by the current detection units 14 under ON control and OFF control of the switches Q1, Q2 are determined to be larger than the initial values $SG1_0$, $SG2_0$. Accordingly, the ON failure of the switches Q1, Q2 can be detected more accurately.

According to the embodiment described above, the initial values $SG1_0$, $SG2_0$ are stored each time the IG switch is turned off, and thus the microcomputer 15 can cancel the influence of zero output even if the zero outputs of the current detection units 14 change. Accordingly, the failure of the switches Q1, Q2 can be detected more accurately.

According to the embodiment described above, the microcomputer 15 detects a failure based on the comparison between the initial values $SG1_0$, $SG2_0$ and the current detection signals $SG1_{on}$, $SG2_{on}$ output by the current detection units 14 when both of the switches Q1, Q2 are controlled to be on. Accordingly, it is possible to detect an OFF failure, i.e., a failure in which a switch cannot be turned on, of the switches Q1, Q2.

According to the embodiment described above, the microcomputer 15 detects the failure of the switches Q1, Q2 when determining that the current detection signals $SG1_{on}$, $SG2_{on}$ output by the current detection units 14 are the same as the initial values $SG1_0$, $SG2_0$ when both of the switches Q1, Q2 are controlled to be on. Accordingly, the OFF failure of the switches Q1, Q2 can be detected more accurately.

According to the embodiment described above, the current detection signals SG1, SG2 received when both of the switches Q1, Q2 are turned off are stored in the memory 15A as the initial values $SG1_0$, $SG2_0$, but the present invention is not limited thereto. Values obtained by adding a predetermined value to the received current detection signals SG1, SG2 may be stored in the memory 15A as the initial values $SG1_0$, $SG2_0$. In this case, it is possible to determine $SG1 \approx SG1_0$ and $SG2 \approx SG2_0$ if the current detection signals SG1, SG2 are equal to or less than the initial values $SG1_0$, $SG2_0$.

According to the embodiment described above, the current path is branched into two branch paths L1, L2, but the present invention is not limited thereto. The branch paths L1, L2 should be branched into a plurality of branch paths and thus may be branched into three or more branch paths. For example, when the current path is branched into three current paths, the microcomputer may turn off a switch in a state in which one or more of three switches are turned on. For example, the microcomputer may turn off one of the three switch and turn on the other two switches, and may change the switch one by one which is to be turned off. Alternatively, the microcomputer may turn on one of the three switches and turn off the other two switches, and may change the switch on one by one which is to be turned on.

According to the embodiment described above, the shunt resistor 14A is used as the current detection unit 14, but the present invention is not limited thereto. A magnetic sensor may be used as the current detection unit 14 as long as a current can be detected.

According to the embodiment described above, the failure detection device detects the failure of the switches Q1, Q2 provided between the batteries 11, 12, but the present invention is not limited thereto. The failure detection device may be used for failure detection of a switch provided between the batteries 11 and the load Lo1, and between the batteries 12 and the load Lo2, respectively.

Another embodiment of the present invention will be described below with reference to the drawings.

Figure 6:
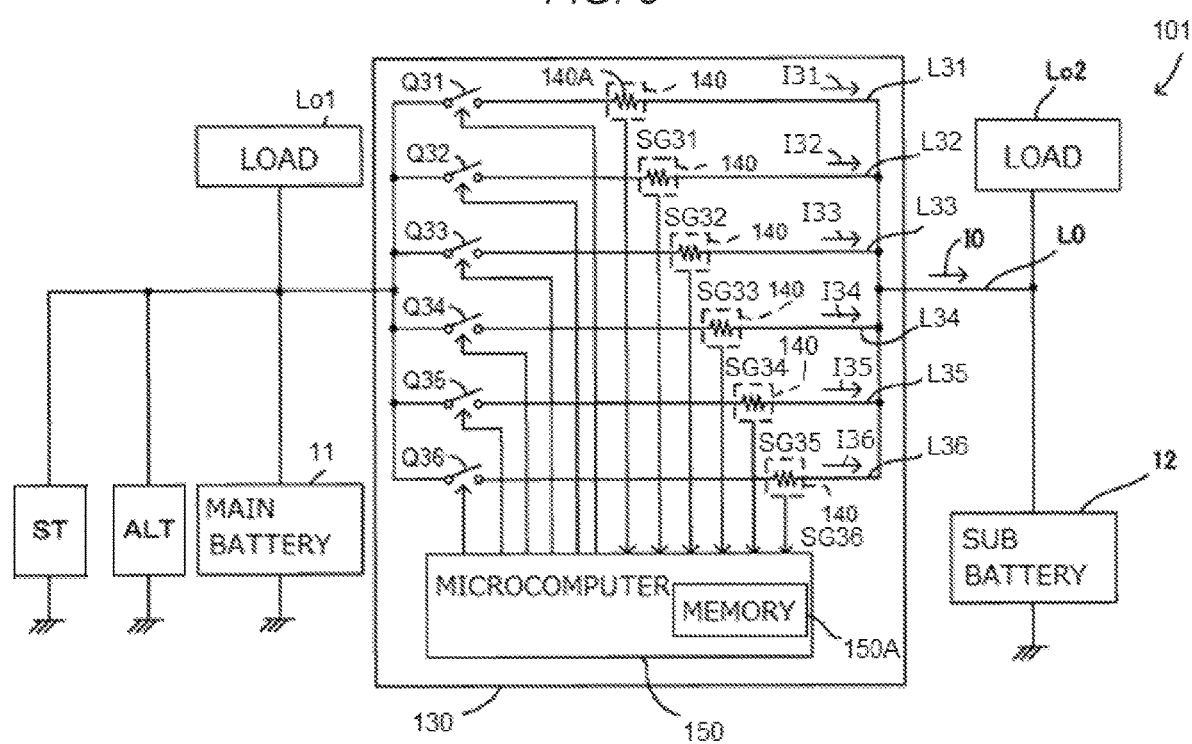
FIG. 6 is a circuit diagram showing a vehicle power supply device including a switch failure detection device according to another embodiment of the present invention.

FIG. 6 is a circuit diagram showing the vehicle power supply device 1 including the switch failure detection device according to another embodiment of the present invention. The vehicle power supply device 1 shown in FIG. 6 includes the main battery 11 and the sub-battery 12 to be mounted on a vehicle.

The main battery 11 and the sub-battery 12 have the same configurations as those in the embodiment of the present invention.

A current path L0 between the main battery 11 and the sub-battery 12 is branched into six current paths including six branch paths L31 to L36. The branch paths L31 to L36 are provided with a switching module 130 (switch failure detection device). The switching module 130 includes a plurality of switches Q31 to Q36 respectively provided on the branch paths L31 to L36, current detection units 140 configured to output current detection signals SG31 to SG36 in accordance with currents I31 to I36 respectively flowing through the plurality of branch paths L31 to L36, and a microcomputer 150. The microcomputer 150 functions as a first switch control unit, a second switch control unit, a failure detection unit, and a control unit.

Figure 7:
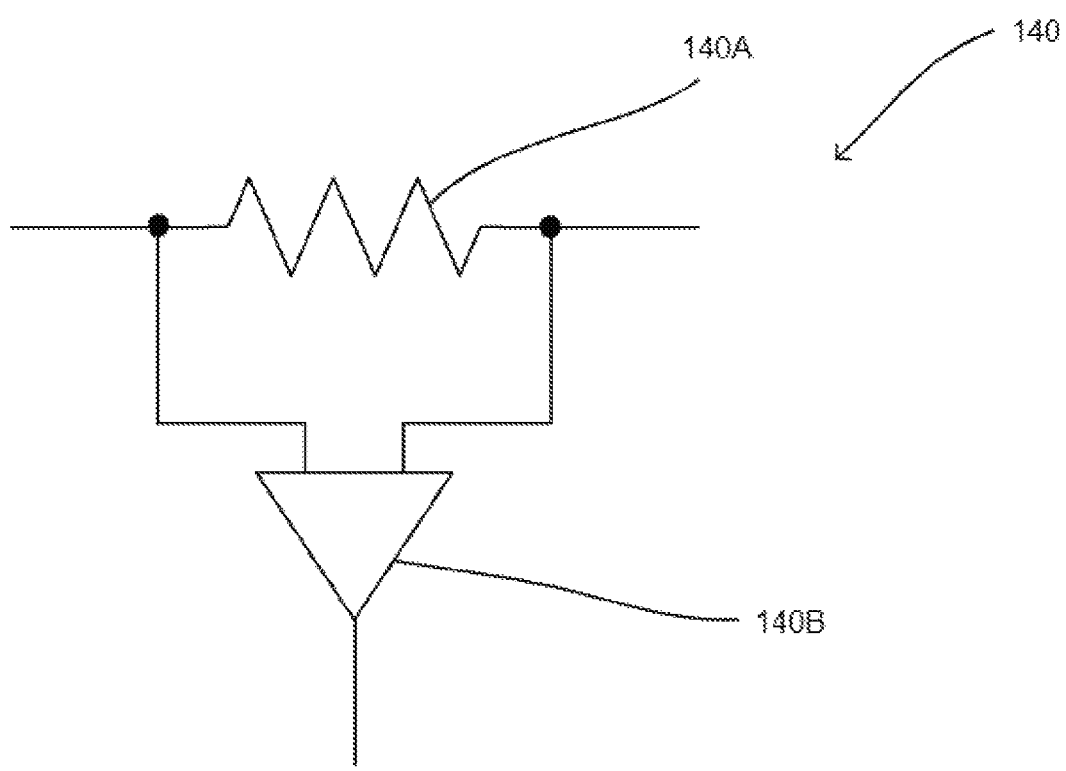
FIG. 7 is a circuit diagram showing an example of a current detection unit shown in FIG. 6.

Each of the switches Q31 to Q36 is formed by an electrolytic effect transistor. As shown in FIG. 7, each of the plurality of current detection units 140 includes a shunt resistor 140A and a differential amplifier 140B configured to amplify difference between voltages at both ends of the shunt resistor 140A. As shown in FIG. 6, the shunt resistor 140A is provided on each of the branch paths L31 to L36. Shunt resistors 140A provided on the branch paths L31 to L36 are connected in series to the switches Q31 to Q36. The differential amplifier 140B is connected to both ends of the shunt resistor 140A, amplifies the difference between voltages at both ends of the shunt resistor 140A, and supplies the amplified voltage to the microcomputer 150 as the current detection signals SG31 to SG36 in accordance with the currents I31 to I36 flowing through the branch paths L31 to L36.

The microcomputer 150 is a well-known microcomputer including a CPU, a ROM, a RAM, and the like, which controls the entire vehicle power supply device 1. The microcomputer 150 is connected to gates of the switches Q31 to Q36 and supplies gate signals to control ON and OFF of the switches Q31 to Q36. The microcomputer 150 includes a memory 150A configured to store initial values $SG31_0$ to $SG36_0$ of the current detection signals SG31 to SG36, which will be described later.

When the microcomputer 150 determines that it is necessary to connect the main battery 11 and the sub-battery 12, for example, when the sub-battery 12 is to be regenerative-charged, all of the switches Q31 to Q36 are turned on. When the switches Q31 to Q36 are controlled to be on, the microcomputer 150 performs a failure diagnosis for detecting a failure of the switches Q31 to Q36.

Next, how a failure detection for the switches Q31 to Q36 is carried out will be described. First, when the switches Q31 to Q36 are turned on, the currents I31 to I36 flow through the branch paths L31 to L36 via the switches Q31 to Q36. When the microcomputer 150 controls the switches Q31 to Q36 to be off and the switches Q31 to Q36 are properly turned off, the currents I31 to I36 flowing through the branch paths L31 to L36 are cut off and the currents I31 to I36 become 0 A. In contrast, when a sticking occurs in the switches Q31 to Q36 and the switches Q31 to Q36 cannot be turned off even if the microcomputer 150 controls the switches Q31 to Q36 to be off, the currents I31 to I36 maintaining the same current values continue flowing through the branch paths L31 to L36. The microcomputer 150 in the present embodiment determines whether there has been a change in the currents I31 to I36 when the switches Q31 to Q36 are turned off one by one, thereby detecting a failure of the switches Q31 to Q36 provided in the branch paths L31 to L36.

Next, ON and OFF control of the switches Q31 to Q36 during the failure diagnosis performed by the microcomputer 150 will be described. In the present embodiment, the microcomputer 150 changes patterns of how the switches Q31 to Q36 are to be turned on or off according to the current I0 flowing through the current path L0.

Figure 8A:
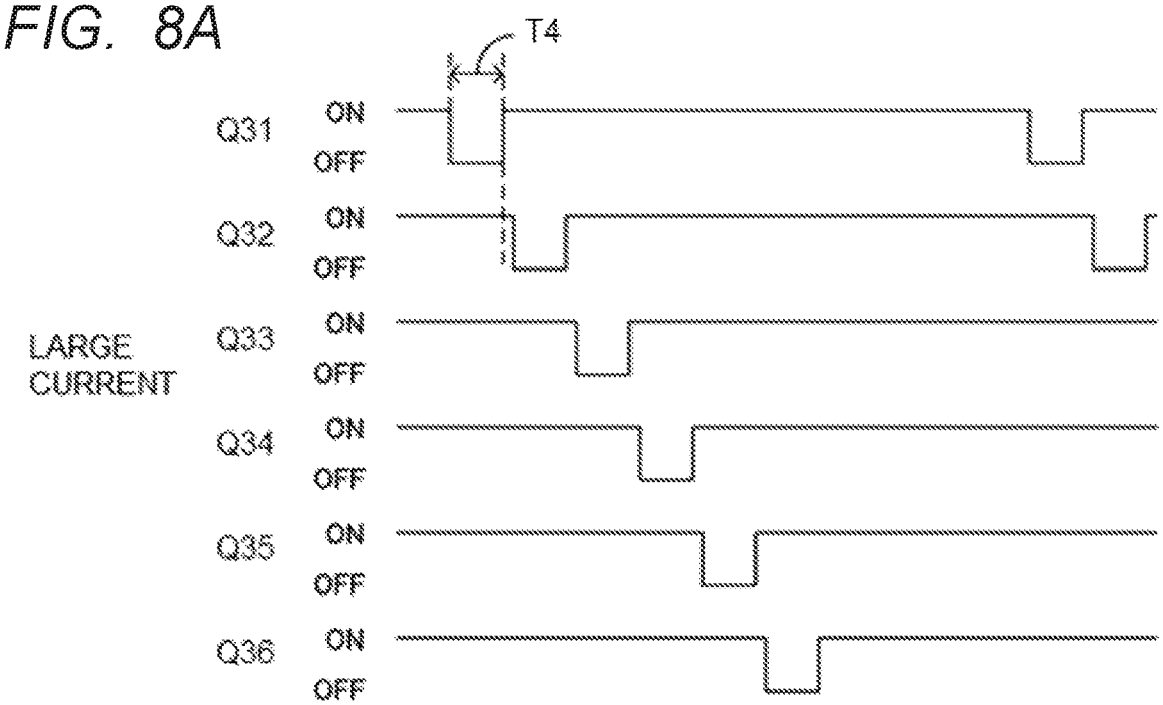
FIG. 8A is a time chart of ON and OFF control of switches Q31 to Q36 when a large current flows.

First, ON and OFF control when the current I0 is large will be described. In this case, as shown in FIG. 8A, when the microcomputer 150 determines that the main battery 11 and the sub-battery 12 need to be connected to each other, the microcomputer 150 turns on all of the switches Q31 to Q36. Next, the microcomputer 150 turns off the plurality of switches Q31 to Q36 one by one for a first predetermined time period T4 from a state in which all of the plurality of switches Q31 to Q36 are turned on. That is, the microcomputer 150 controls one of the plurality of switches Q31 to Q36 to be off and the other five switches to be on, and switches the one of the plurality of switches Q31 to Q36 to be controlled off one by one. Therefore, the current I0 flowing through the current path L0 is divided and flows into five of the six branch paths L31 to L36.

Accordingly, when the current is large, the extent of change in current when the switches Q31 to Q36 are turned on and off can be limited to a range of current I0×⅕ to 0 A. The extent of change in current in the present embodiment can be reduced to about ⅓ of that in a case where the current path L0 is branched into only two branch paths L31, L32. Accordingly, it is possible to improve accuracy in detection and burden on the switches Q31 to Q36 that might be brought about by a change in current.

In the present embodiment, when changing one of the switches Q31 to Q36 to be turned off, the microcomputer 150 turns off a next switch after one of the switches Q31 to Q36 which is currently turned off is turned on. That is, there is provided a time period in which all of the switches Q31 to Q36 are turned on, the time period lying between a time of one of the switches Q31 to Q36 that has been turned off being turned on and a time of the next one of the switches Q31 to Q36 being turned off.

Figure 8B:
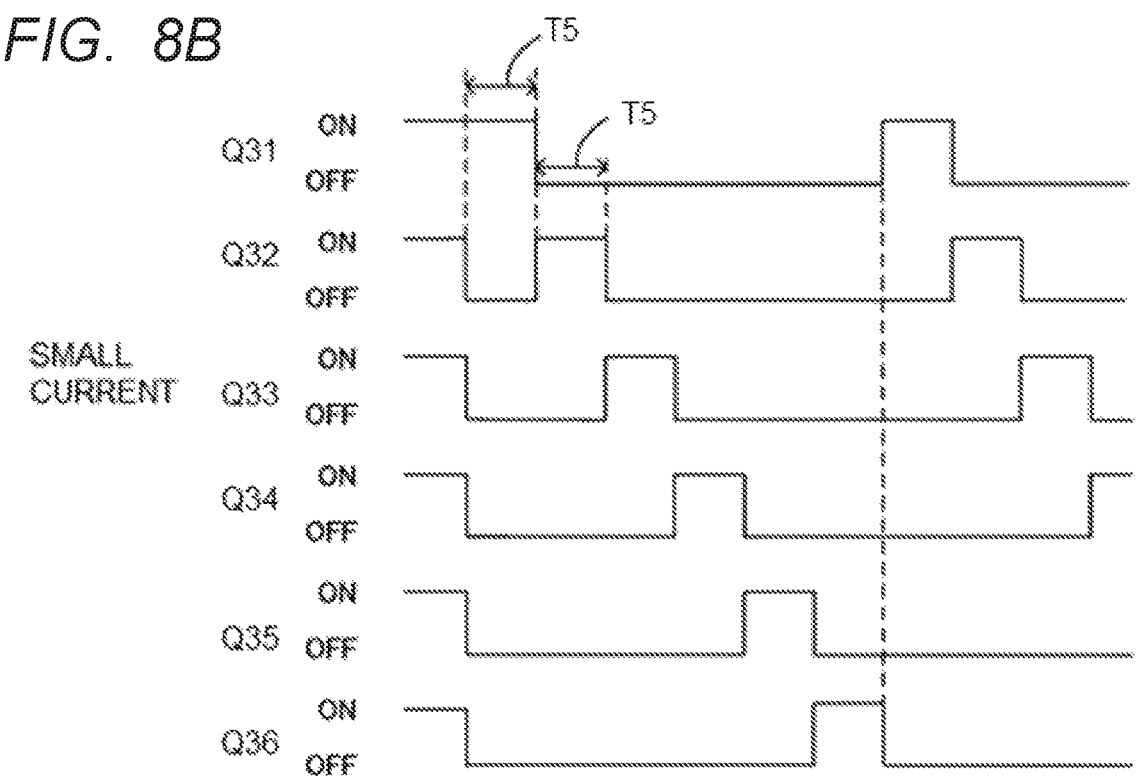
FIG. 8B is a time chart of ON and OFF control of the switches Q31 to Q36 when a small current flows.

Next, ON and OFF control when the current I0 is small will be described. In this case as shown in FIG. 8B, when the microcomputer 150 determines that the main battery 11 and the sub-battery 12 need to be connected to each other, the microcomputer 150 controls all of the switches Q31 to Q36 to be on. Next, the microcomputer 150 controls the switch Q31 to be on for a second predetermined time period T5 and the other switches Q32 to Q36 to be off. Thereafter, the microcomputer 150 controls the switches Q32 to Q36 to be on one by one for the second predetermined time period T5. That is, the microcomputer 150 controls one of the plurality of switches Q31 to Q36 to be on and the other five switches to be off, and switches the one of the switches Q31 to Q36 to be controlled on one by one. Therefore, the current I0 flowing through the current path L0 flows to only one of the six branch paths L31 to L36.

Accordingly, when the current is small, the extent of change in current when the switches Q31 to Q36 are turned on and off can be emphasized to a range of current I0 to 0 A and the failure detection accuracy for the switches Q31 to Q36 can be improved.

In the present embodiment, when changing one of the switches Q31 to Q36 to be turned on, the microcomputer 150 turns on one of the switches Q31 to Q36 in the next order at the same time as the timing when one of the switches Q31 to Q36 that has been turned on is turned off.

Next, detailed operation of the vehicle power supply device 1 described above will be described with reference to a flowchart in FIG. 9. First, the microcomputer 150 receives the current detection signals SG31 to SG36 that have been output from the current detection units 140 when an ignition (IG) switch is turned off and stores the current detection signals SG31 to SG36 in the memory 150A as the initial values $SG31_0$ to $SG36_0$, thereby performing pre-start inspection (step S31). When the IG switch is turned on (when the vehicle is traveling and the batteries 11, 12 are electrically conductive), the microcomputer 150 performs the failure diagnosis of the switches Q31 to Q36 (step S32 to S39).

Details of the pre-start inspection in step S31 will be described with reference to FIG. 4, as in the first embodiment of the present invention. First, the microcomputer 150 turns off all of the switches Q31 to Q36 (step S11). Accordingly, the currents I31 to I36 flowing through the branch paths L31 to L36 become 0 A. Next, the microcomputer 150 receives the current detection signals SG31 to SG36 that have been output from the current detection units 140 respectively provided in the branch paths L31 to L36 (step S12). Thereafter, the microcomputer 150 stores the received current detection signals SG31 to SG36 as the initial values $SG31_0$ to $SG36_0$ of each of the current detection units 140 (step S13) and the processing ends.

Figure 9:
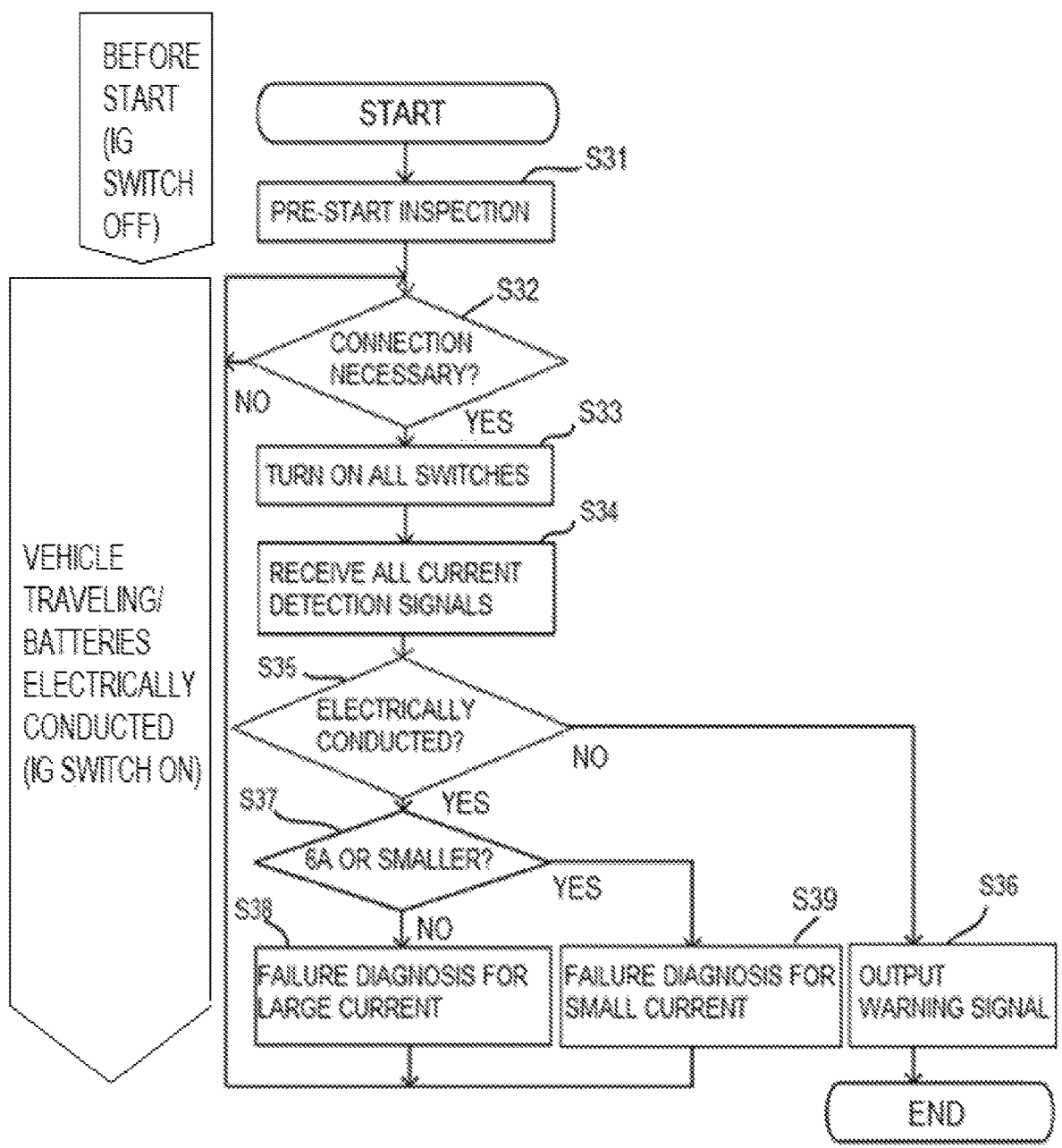
FIG. 9 is a flowchart showing a processing procedure of a microcomputer shown in FIG. 6.

When the IG switch is turned on, the microcomputer 150 determines whether the main battery 11 and the sub-battery 12 need to be connected to each other (step S32 in FIG. 9). When determining that the connection is necessary (Y in step S32), the microcomputer 150 turns on all of the switches Q31 to Q36 (step S33) to connect the main battery 11 and the sub-battery 12. Next, the microcomputer 150 receives all of the current detection signals SG31 to SG36 (step S34). The microcomputer 150 temporarily stores the current detection signals SG31 to SG36 received in step S34 in the memory 150A as current detection signals $SG31_{onL}$ to $SG36_{onL}$ when the switches Q31 to Q36 are turned on, i.e. the switches Q31 to Q36 are under ON control.

Thereafter, the microcomputer 150 respectively compares the current detection signals $SG31_{onL}$ to $SG36_{onL}$ with the initial values $SG31_0$ to $SG36_0$ stored in the memory 150A to determine whether the branch paths L31 to L36 are electrically conducted conductive (step S35).

In step S35, if at least one of $SG31_{onL} \approx SG31_0$, $SG32_{onL} \approx SG32_0$, $SG33_{onL} \approx SG33_0$, $SG34_{onL} \approx SG34_0$, $SG35_{onL} \approx SG35_0$, and $SG36_{onL} \approx SG36_0$ is satisfied, the microcomputer 150 determines that at least one of the switches Q31 to Q36 is not turned on and thus at least one of the branch paths L31 to L36 is not electrically conductive (=at least one of the currents I31 to I36 is 0 A). To be precise, the microcomputer 150 determines $SGn_{onL} \approx SGn_0$ (n is an arbitrary integer of 1 to 6) when $SGn_{onL} \leq (SGn_0 + \text{predetermined value})$.

When determining that one of the branch paths L31 to L36 is not electrically conductive (N in step S35), the microcomputer 150 outputs a warning signal (step S36) and the processing ends. When receiving the warning signal, a meter (not shown) notifies of an OFF failure in which at least one of the switches Q31 to Q36 is kept off and cannot be turned on.

When determining that all of the branch paths L31 to L36 are electrically conductive (Y in step S35), the microcomputer 150 obtains the current I0 as a sum of the current detection signals SG31 to SG36. If the obtained current I0 is larger than, for example, 6 A (N in step S37), the microcomputer 150 performs a failure diagnosis for a large current of controlling the switches Q31 to Q36 and detection of failure (step S38) as shown in FIG. 8A. On the other hand, if the current I0 is, for example, equal to or less than 6 A (Y in step S37), the microcomputer 150 performs a failure diagnosis for a small current of controlling the switches Q31 to Q36 and detection of failure (step S39) as shown in FIG. 8B.

Figure 10:
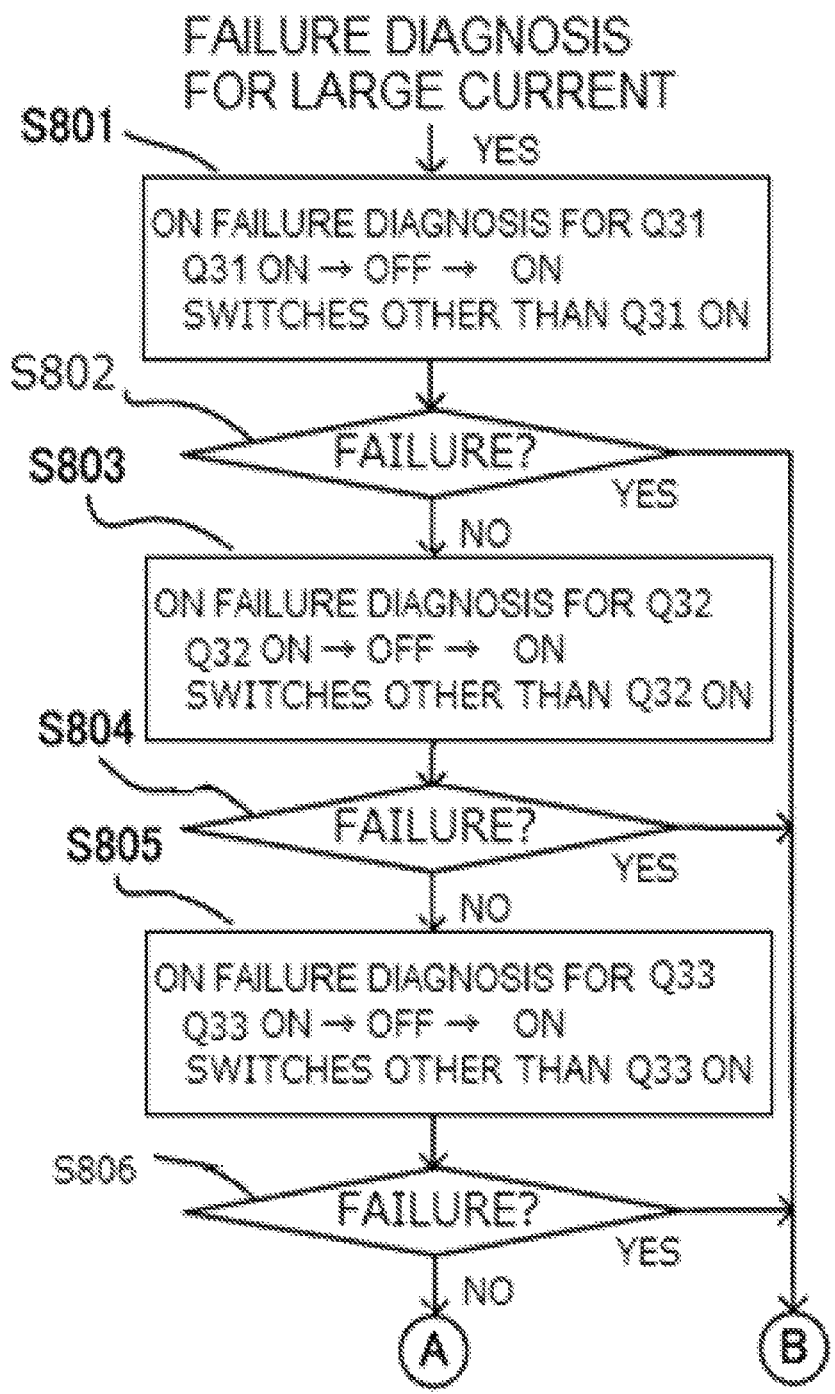
FIG. 10 is a flowchart showing a procedure of failure diagnosis for a large current of the microcomputer shown in FIG. 6.

Processing details of the failure diagnosis for a large current will be described with reference to FIG. 10. First, the microcomputer 150 controls the switch Q31 to be off for the first predetermined time period T4 and to be on again (step S801). The switches Q32 to Q36 other than the switch Q31 remain to be on. The microcomputer 150 receives the current detection signal SG31 that has been output from the current detection unit 140 when the switch Q31 is turned off in step S801, and temporarily stores the current detection signal SG31 in the memory 150A as a current detection signal $SG31_{offL}$ when the switch Q31 is turned off, i.e. the switch Q31 is under OFF control.

Next, the microcomputer 150 detects a failure of the switch Q31 based on a comparison between the current detection signal $SG31_{onL}$ under ON control and the initial value $SG31_0$ stored in the memory 150A and a comparison of the current detection signal $SG31_{offL}$ under OFF control and the initial value $SG31_0$ (step S802).

In step S802, if $SG31_{onL} > SG31_0$ and $SG31_{offL} \approx SG31_0$, the microcomputer 150 determines that the current I31 has changed by turning off the switch Q31 and that the switch Q31 is working properly. If $SG31_{onL} > SG31_0$ and $SG31_{offL} > SG31_0$, the microcomputer 150 determines that the current I31 has not changed and the switch Q31 is not turned off, thereby detecting the failure of the switch Q31. To be precise, the microcomputer 150 determines $SG31_{onL}$, $SG31_{offL} > SG31_0$ when $SG31_{onL}$, $SG31_{offL} > (SG31_0 + \text{predetermined value})$, and determines $SG31_{offL} \approx SG31_0$ when $SG31_{offL} \leq (SG31_0 + \text{predetermined value})$.

When detecting the failure of the switch Q31 (Y in step S802), the microcomputer 150 outputs a diagnosis signal (step S814) and the processing proceeds to step S813. When receiving the diagnosis signal, the meter (not shown) notifies of an ON failure in which the switch Q31 is kept to be on and cannot be turned off.

When the microcomputer 150 determines that the switch Q31 is working properly (N in step S802), the processing proceeds to next steps S803 to S812 in which the microcomputer 150 controls the switches Q32 to Q36 to be off one by one and performs an ON failure diagnosis of the switches Q32 to Q36. The ON failure diagnosis of the switches Q32 to Q36 is carried out in the same manner as for the switch Q31, therefore a detailed explanation will be omitted here.

When the microcomputer 150 determines that all of the switches Q31 to Q36 are working properly (N in step S812), the processing proceeds to next step S813. In step S813, the microcomputer 150 turns on all of the switches Q31 to Q36 and the processing returns to step S801 again. The failure diagnosis processing for a large current is repeated until it is determined that it is no longer necessary to connect the main battery 11 and the sub-battery 12 to each other.

Next, details of the failure diagnosis for a small current will be described with reference to FIG. 11. The microcomputer 150 controls the switch Q31 to be on and the other switches Q32 to Q36 to be off (step S901). When the second predetermined time period T5 elapses after the switch Q31 is turned on, the microcomputer 150 turns off the switch Q31 and turns on the switch Q32 at the same time. The microcomputer 150 respectively receives the current detection signal SG31 that has been output from the current detection unit 140 when the switch Q31 is controlled to be on and off in step S901, and temporarily stores a current detection signal $SG31_{onS}$ under ON control and a current detection signal $SG31_{offS}$ under OFF control in the memory 150A.

Next, the microcomputer 150 detects a failure of the switch Q31 based on a comparison between the current detection signal $SG31_{onS}$ under ON control and the initial value $SG31_0$ stored in the memory 150A and a comparison of the current detection signal $SG31_{offS}$ under OFF control and the initial value $SG31_0$ (step S902).

In step S902, if $SG31_{onS} > SG31_0$ and $SG31_{offS} \approx SG31_0$, the microcomputer 150 determines that the current I31 has changed by turning off the switch Q31 and that the switch Q31 is working properly. If $SG31_{onS} > SG31_0$ and $SG31_{offS} > SG31_0$ the microcomputer 150 determines that the current I31 has not changed and the switch Q31 is not turned off, thereby detecting the failure of the switch Q31. To be precise, the microcomputer 150 determines $SG31_{onS}$, $SG31_{offS} > SG31_0$ when $SG31_{onS}$, $SG31_{offS} > (SG31_0 + \text{predetermined value})$, and determines $SG31_{offS} \approx SG31_0$ when $SG31_{offS} \leq (SG31_0 + \text{predetermined value})$.

When detecting the failure of the switch Q31 (Y in step S902), the microcomputer 150 outputs a diagnosis signal (step S914) and the processing ends. When receiving the diagnosis signal, the meter (not shown) notifies of an ON failure in which the switch Q31 is kept to be on and cannot be turned off.

When the microcomputer 150 determines that the switch Q31 is working properly (N in step S902), the processing proceeds to next steps S903 to S912 in which the microcomputer 150 controls the switches Q32 to Q36 to be on one by one and performs an ON failure diagnosis of the switches Q32 to Q36. The ON failure diagnosis of the switches Q32 to Q36 is carried out in the same manner as for the switch Q31, therefore a detailed explanation will be omitted here.

When the microcomputer 150 determines that all of the switches Q31 to Q36 are working properly (N in step S912), the processing proceeds to step S913 in which the microcomputer 150 turns on all of the switches Q31 to Q36. The processing then returns to step S901 again. The failure diagnosis processing for a small current is repeated until it is determined that it is no longer necessary to connect the main battery 11 and the sub-battery 12 to each other.

According to the embodiment described above, the microcomputer 150 performs control of the switches Q31 to Q36 shown in FIG. 8A when the current I0 flowing through the current path L0 is large. That is, during the failure diagnosis for a large current, the microcomputer 150 controls one of the plurality of switches Q31 to Q36 to be off and the other switches to be on and switches the switches Q31 to Q36 to be controlled off one by one, so that the extent of change in current in response to OFF control of the switches Q31 to Q36 when the current is large can be reduced and it is possible to reduce burden on the switches Q31 to Q36 while improving detection accuracy at the same time. When the current flowing through the current path L0 is small, the microcomputer 150 controls the switches Q31 to Q36 as shown in FIG. 8B. That is, during the failure diagnosis for a small current, the microcomputer 150 controls one of the plurality of switches Q31 to Q36 to be on and the other switches to be off and switches the switches Q31 to Q36 to be controlled on one by one, so that the extent of change in current in response to ON control of the switches Q31 to Q36 when the current is small can be emphasized and the failure detection accuracy for the switches Q31 to Q36 can be improved.

According to the present embodiment, when switching the switches Q31 to Q36 to be controlled on during the failure diagnosis for a small current, the microcomputer 150 turns on a switch in a next order at the same time as the timing when one of the switches Q31 to Q36 that has been turned on is turned off. Accordingly, it is possible to quickly perform the failure detection for the switches Q31 to Q36.

Figure 12:
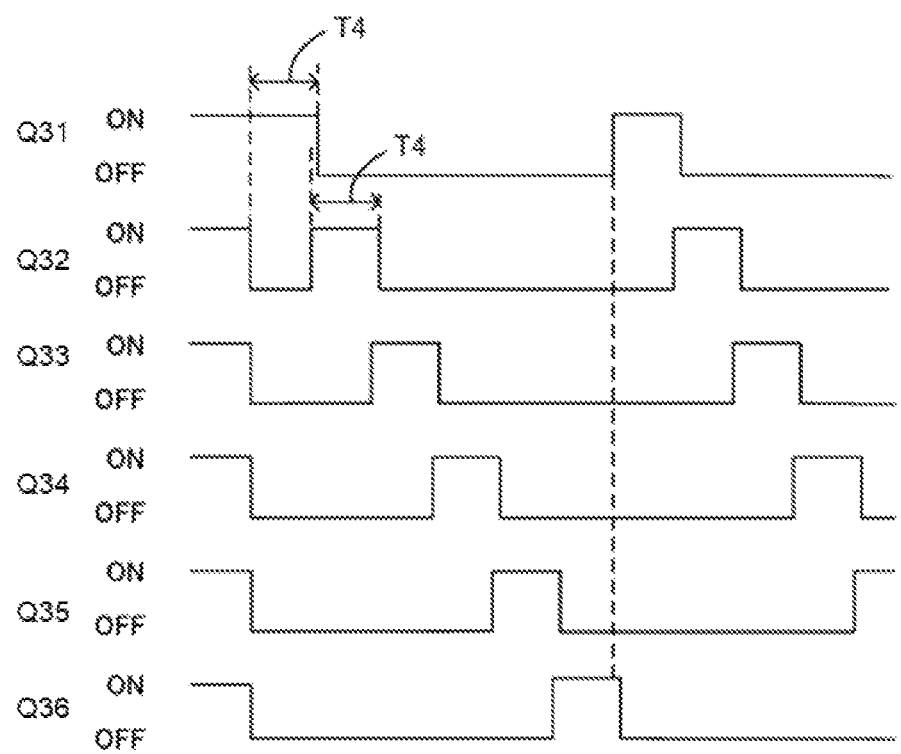
FIG. 12 is a time chart of ON and OFF control of the switches Q31 to Q36 when a small current flows according to the other embodiment.

As shown in FIG. 12, when switching the switches Q31 to Q36 to be controlled on during the failure diagnosis for a small current, the microcomputer 150 may turn on one of the switches Q31 to Q36 in a next order before one of the switches Q31 to Q36 that has been turned on is turned off. By doing so, the current can be stably supplied.

According to the embodiment described above, the current path L0 is branched into six branch paths L31 to L36, but the present invention is not limited thereto. The current path L0 may be branched into three or more current paths.

According to the embodiment described above, the shunt resistor 140A is used as the current detection unit 140, but the present invention is not limited thereto. A magnetic sensor may be used as the current detection unit 140 as long as a current can be detected.

According to the embodiment described above, the failure detection device detects the failure of the switches Q31 to Q36 provided between the batteries 11, 12, but the present invention is not limited thereto. The failure detection device may be used for failure detection of a switch provided between the batteries 11, 12 and the loads Lo1, Lo2.

While the present invention has been described with reference to certain exemplary embodiments thereof, the scope of the present invention is not limited to the exemplary embodiments described above, and it will be understood by those skilled in the art that various changes and modifications may be made therein without departing from the scope of the present invention as defined by the appended claims.

According to an aspect of the embodiments described above, a switch failure detection device (13) includes a plurality of switches (Q1, Q2) respectively provided on a plurality of branch paths (L1, L2), a current path branching into the plurality of current paths (L1, L2), a plurality of current detection units (14) provided on the plurality of branch paths (L1, L2) respectively, each of the current detection units (14) being configured to output current detection signal (SG1, SG2) in accordance with an electrical current (I1, I2) flowing through each of the plurality of branch paths (L1, L2), a storage unit configured to store an initial value of the current detection signal (SG1, SG2), the initial value being to be output from each of the current detection units (14) when the plurality of switches (Q1, Q2) are turned off, a switch control unit (15) configured to turn off one of the plurality of switches (Q1, Q2) with at least another one of the plurality of switches (Q1, Q2) being turned on and a first failure detection unit (15) configured to compare the initial value and a value of a first current detection signal (SG1, SG2) output from corresponding one of the current detection units (14) when the one of the plurality of switches (Q1, Q2) is turned off by the switch control unit (15), the first failure detection unit (15) being configured to detect a first failure of the plurality of switches (Q1, Q2) based on a result of the comparison.

According to the switch failure detection device having the above configuration, the first failure detection unit detects the failure of the switches based on the comparison between the current detection signal of one of the switches when the one of the switches is turned off and the initial value of the one of the switches. Accordingly, an influence of zero outputs of the current detection signals can be canceled even without performing offset adjustments of the current detection units, and the detection accuracy for an ON failure, a first failure in which the switches cannot be turned off, of the switches can be improved even if the currents have changed.

The first failure detection unit (15) may be configured to compare the initial value and a value of a second current detection signal (SG1, SG2) output from the corresponding one of the current detection units (14) when the one of the plurality of switches (Q1, Q2) is turned on, the first failure detection unit (15) being configured to detect a second failure of the switches (Q1, Q2) based on a result of the comparison.

According to the switch failure detection device having the above configuration, the first failure detection unit detects the failure of the switches based on the comparison between the initial values and the current detection signals when the switches are tuned on. Accordingly, the failure can be detected based on a change in current when the switches are turned on, and thus an OFF failure, a second failure in which the switches cannot be turned on, of the switches can be detected more accurately.

The first failure detection unit (15) may detect the first failure of the switches (Q1, Q2) when the values of both of the first and second current detection signals (SG1, SG2) are greater than the initial value.

According to the switch failure detection device having the above configuration, the first failure detection unit detects the failure of the switches when determining that the value of the first and second current detection signals that have been output from the current detection units when the switches are turned on and off are larger than the initial values. Accordingly, the ON failure of the switches can be detected more accurately.

The switch failure detection device (13) may be mounted on a vehicle, and the storage unit (15A) may be configured to store the initial value each time an ignition switch of the vehicle is turned off.

According to the switch failure detection device having the above configuration, the initial values are stored each time the ignition switch is turned off, and thus the influence of zero output can be canceled even if the zero outputs of the current detection units change. Accordingly, the failure of the switches can be detected more accurately.

The switch failure detection device (13) may further include a second failure detection unit (15) configured to compare the initial value and the value of the second current detection signal (SG1, SG2) output by the current detection units (14) when all of the plurality of switches (Q1, Q2) are turned on by the switch control unit (15), the second failure detection unit being configured to detect the second failure of the switches (Q1, Q2) based on a result of the comparison.

According to the switch failure detection device having the above configuration, it is possible to detect the OFF failure, the second failure that a switch cannot be turned on, of the switches.

The switch control unit (15) may be configured to detect the second failure of the switches (Q1, Q2) when the value of the second current detection signal (SG1, SG2) output by the current detection units (14) when all of the plurality of switches (Q1, Q2) are turned on by the switch control unit (15) is equal to the initial value.

According to the switch failure detection device having the above configuration, it is possible to detect the OFF failure of the switch more accurately.

According to another aspect of the embodiments described above, a switch failure detection device (13) includes a plurality of switches (Q31 to Q36) respectively provided on a plurality of branch paths (L31 to L36), a current path (L0) branching into three or more current paths, a plurality of current detection units (140) provided on the plurality of branch paths (L31 to L36) respectively, each of the current detection units (140) being configured to detect an electrical current (I31 to I36) flowing through each of the plurality of branch paths (L31 to L36), a first switch control unit (150) configured to turn off one of the plurality of switches (Q31 to Q36) and turn on the other ones of the plurality of switches, the first switch control unit (150) being configured to switch the one of the plurality of switches (Q31 to Q36) to be turned off to another one of the plurality of switches (Q31 to Q36), a second switch control unit (150) configured to turn on one of the plurality of switches (Q31 to Q36) and turn off the others of the plurality of switches, the second switch control unit (150) being configured to switch the one of the plurality of switches (Q31 to Q36) to be turned on one by one to another one of the plurality of switches (Q31 to Q36), a failure detection unit (150) configured to detect a failure of the switches (Q31 to Q36) based on the current (I31 to I36) detected by each of the plurality of current detection units (140) while the switches (Q31 to Q36) are being controlled by the first and second switch control units (150) and a control unit (150) configured to allow the first switch control unit (150) to control the plurality of switches (Q31 to Q36) when a value of a current flowing through the current path (L0) is a first value, the control unit (150) being configured to allow the second switch control unit (150) to control the plurality of switches (Q31 to Q36) when a value the current flowing through the current path (L0) is a second value being smaller than the first value.

According to the switch failure detection device having the configuration, control is performed by the first switch control unit when the value of the current flowing through the current path is large (first value). The first switch control unit controls one of the plurality of switches to be off and the other switches to be on and switches the switches to be controlled off one by one to another one of the switches, so that the extent of change in current brought about by the switches being turned off when the current is large can be reduced and it is possible to reduce burden on the switches while improving detection accuracy. When the value of the current flowing through the current path is small (second value smaller than the first value), control is performed by the second switch control unit. The second switch control unit controls one of the plurality of switches to be on and the other switches to be off and switches the switches to be controlled on one by one, so that change in current brought about by the switches being turned on when the current is small can be emphasized and failure detection accuracy for the switches can be improved.

The second switch control unit (150) may be configured, when the second switch control unit (150) switches the one of the plurality of switches (Q31 to Q36) to be turned on to the another one of the plurality of switches (Q31 to Q36), to turn on the another one of the plurality of switches at the same time as the one of the plurality of switches (Q31 to Q36) that has been turned on is turned off.

According to the switch failure detection device having the above configuration, when switching the switches to be controlled on, the second switch control unit turns on the switches in a next order at the same time as the timing when the switch that has been turned on is turned off. Accordingly, it is possible to save time by quickly performing the detection of failure of the switches.

The second switch control unit (150) may be configured, when the second switch control unit (150) switches the one of the plurality of switches (Q31 to Q36) to be turned on to the another one of the plurality of switches (Q31 to Q36), to turn on the another one of the plurality of switches before turning off the one of the plurality of switches (Q31 to Q36) that has been turned on.

According to the switch failure detection device having the above configuration, when switching the switches to be controlled on, the second switch control unit controls the switches in a next order to be on before the switch that has been turned on is turned off. Accordingly, the current can be supplied in a stable manner.

What is claimed is:

1. A switch failure detection device comprising:
a plurality of switches respectively provided on a plurality of branch paths, a current path branching into the plurality of branch paths;
a plurality of current detection circuits provided on the plurality of branch paths respectively, each of the current detection circuits being configured to output a current detection signal in accordance with an electrical current flowing through each of the plurality of branch paths;
a memory configured to store an initial value of the current detection signal, the initial value being output from each of the current detection circuits when the plurality of switches are turned off;
a switch control unit configured to turn off one of the plurality of switches with at least another one of the plurality of switches being turned on; and
a first failure detection unit configured to compare the initial value and a value of a first current detection signal output from corresponding one of the current detection circuits when the one of the plurality of switches is turned off by the switch control unit, the first failure detection unit being further configured to detect a first failure of the plurality of switches based on a result of the comparison.

2. The switch failure detection device according to claim 1,
wherein the first failure detection unit is configured to compare the initial value and a value of a second current detection signal output from the corresponding one of the current detection circuits when the one of the plurality of switches is turned on, the first failure detection unit being further configured to detect a second failure of the plurality of switches based on a result of the comparison.

3. The switch failure detection device according to claim 2,
wherein the first failure detection unit detects the first failure of the plurality of switches when the values of both of the first and second current detection signals are greater than the initial value.

4. The switch failure detection device according to claim 1,
wherein the switch failure detection device is mounted on a vehicle, and
wherein the memory is configured to store the initial value each time an ignition switch of the vehicle is turned off.

5. The switch failure detection device according to claim 1, further comprising:
a second failure detection unit configured to compare the initial value and the value of the second current detection signal output by the current detection circuits when all of the plurality of switches are turned on by the switch control unit, the second failure detection unit being further configured to detect a second failure of the plurality of switches based on a result of the comparison.

6. The switch failure detection device according to claim 5,
wherein the second failure detection unit is configured to detect the second failure of the plurality of switches when the value of the second current detection signal output by the current detection circuits, in a case all of the plurality of switches are turned on by the switch control unit is equal to the initial value.

7. A switch failure detection device comprising:
a plurality of switches respectively provided on three or more branch paths, a current path branching into the three or more branch paths;
a plurality of current detection circuits provided on the three or more branch paths respectively, each of the current detection circuits being configured to detect an electrical current flowing through each of the three or more branch paths;

a first switch control unit configured to turn off one of the plurality of switches and turn on other ones of the plurality of switches, the first switch control unit being configured to switch the one of the plurality of switches to be turned off to another one of the plurality of switches;

a second switch control unit configured to turn on one of the plurality of switches and turn off the other ones of the plurality of switches, the second switch control unit being configured to switch the one of the plurality of switches to be turned on to another one of the plurality of switches;

a failure detection unit configured to detect a failure of the switches based on the electrical current detected by each of the plurality of current detection circuits while the switches are being controlled by the first and second switch control units; and a control unit configured to allow the first switch control unit to control the plurality of switches when a value of a current flowing through the current path is a first value, the control unit being configured to allow the second switch control unit to control the plurality of switches when a value of the current flowing through the current path is a second value smaller than the first value.

8. The switch failure detection device according to claim 7, wherein the second switch control unit is configured to turn on, when the second switch control unit switches the one of the plurality of switches to be turned on to the other one of the plurality of switches, the other one of the plurality of switches at the same time as the one of the plurality of switches that has been turned on is turned off.

9. The switch failure detection device according to claim 7, wherein the second switch control unit is configured to turn on, when the second switch control unit switches the one of the plurality of switches to be turned on to the other one of the plurality of switches, the other one of the plurality of switches before turning off the one of the plurality of switches that has been turned on.

* * * * *